United States Patent
Kamino et al.

(10) Patent No.: US 7,843,717 B2
(45) Date of Patent: Nov. 30, 2010

(54) SEMICONDUCTOR STORAGE DEVICE

(75) Inventors: Tomoyuki Kamino, Tokyo (JP); Toru Ishikawa, Tokyo (JP); Hiroshi Ichikawa, Tokyo (JP)

(73) Assignee: Elpida Memory, Inc., Tokyo (JP)

( * ) Notice: Subject to any disclaimer, the term of this patent is extended or adjusted under 35 U.S.C. 154(b) by 192 days.

(21) Appl. No.: 12/292,380

(22) Filed: Nov. 18, 2008

(65) Prior Publication Data
US 2009/0129137 A1    May 21, 2009

(30) Foreign Application Priority Data
Nov. 20, 2007   (JP)   ............................. 2007-300931

(51) Int. Cl.
*G11C 5/06* (2006.01)
(52) U.S. Cl. ............... 365/63; 365/189.15; 365/189.16; 365/205; 365/230.03
(58) Field of Classification Search ............ 365/63, 365/189.15, 189.16, 205, 230.03
See application file for complete search history.

(56) References Cited

U.S. PATENT DOCUMENTS

| 6,678,204 | B2 | 1/2004 | Nagashima et al. |
| 6,809,946 | B2 | 10/2004 | Fujisawa et al. |
| 7,266,037 | B2 | 9/2007 | Mochida |
| 2007/0147152 | A1* | 6/2007 | Sekiguchi et al. ........... 365/207 |
| 2008/0013397 | A1* | 1/2008 | Park et al. .............. 365/230.06 |

FOREIGN PATENT DOCUMENTS

| JP | 05-234377 | 9/1993 |
| JP | 2003-223785 | 8/2003 |
| JP | 2003-346479 | 12/2003 |
| JP | 2006-172577 | 6/2006 |

* cited by examiner

*Primary Examiner*—Hoai V Ho
(74) *Attorney, Agent, or Firm*—Foley & Lardner LLP

(57) ABSTRACT

A semiconductor storage device includes a memory array compartmentalized into first and second regions alternately arranged. The second regions are formed by odd and even columns alternately arranged. The semiconductor storage device includes: a memory mat array arranged in each first region; a sense amp array arranged in each second region; local IO lines arranged in each second region and connected to the sense amp array; main IO lines crossing the first and second regions; and a read/write amplifier arranged in each second region and at an intersection region where the local IO lines cross the main IO lines. The read/write amplifier in an odd column is connected to a local IO line therein and to a local IO line in the next odd column. The read/write amplifier in an even column is connected to a local IO line therein and to a local IO line in the next even column.

7 Claims, 8 Drawing Sheets

SEMICONDUCTOR STORAGE DEVICE

BACKGROUND OF THE INVENTION

1. Field of the Invention

The present invention relates to a semiconductor storage device that is preferably used as synchronous DRAM (Dynamic Random Access Memory).

Priority is claimed on Japanese Patent Application No. 2007-300931, filed Nov. 20, 2007, the content of which is incorporated herein by reference.

2. Description of the Related Art

A memory array (also referred to as a memory cell array) in a semiconductor storage device includes sense amps that amplify data from each of memory cells, sub-word drivers that drive a word line, and a memory mat (hereinafter, "MAT") that includes multiple memory cells and is surrounded by an array of the sense amps and the sub-word drivers.

A local IO line (Input-Output line) (hereinafter, "LIO") that connects sense amps forming a sense amp sequence between the memory mats to one another, and a main IO line (hereinafter, "MIO") crossing LIO and shared by all of the memory mats are arranged in the memory array. An amplifier (called a read/write amp or a sub-amp, hereinafter called a "read/write amp") that amplifies data is arranged at an LIO-and-MIO intersection region (see FIG. 1). In DDR2 SDRAM (Double Data Rate 2 Synchronous Dynamic Random Access Memory), four inputs and outputs of data are simultaneously executed through LIO and MIO with respect to 1 DQ (1 data signal) to support a 4-bit prefetch.

FIG. 1 is a schematic plane view showing the arrangement of read/write amps in the memory array. An 8M-bit memory space in the case of 512M-bit DDR2 is shown. Sense amp regions SAs each including multiple sense amps, LIOs connected to the sense amps, sub-word driver regions SWDs each including a sub-word driver having the configuration in which a driver of a word line is divided, MIOs that are shared by all of the memory mats are arranged among MATs. Since four inputs and outputs are required for 1 DQ to support a 4-bit prefetch, four MIOs are simultaneously used in the configuration shown in FIG. 1. One read/write amp (hereinafter, "RWA") is arranged at each intersection region of two LIOs with two MIOs in the case of FIG. 1.

In the configuration, four RWAs surrounding one MAT to be accessed are activated upon the reading and writing of 1 DQ data.

When 2 DQ (2 data signals) are allocated to the same memory region as that in an original product such as DDR SDRAM utilizing 2-bit prefetch to reduce memory capacity or implement multiple I/O (input/output), the number of MIOs become double, and two RWAs need to be arranged at the MIO-and LIO intersection region. However, regions among MATs widen when two RWAs are arranged at each intersection region, and thereby, the entire area of the memory array increases.

Japanese Unexamined Patent Applications, First Publication Nos. 2003-223785, H05-234377, 2006-172577, and 2003-346479 are prior arts concerning control of memory mats, banks, and plates that are formed by compartmentalizing the memory array.

However, none of the prior arts can solve the problem of the area increase when two RWAs are arranged at each MIO-and-LIO intersection region.

SUMMARY

A semiconductor storage device according to one aspect of the present invention includes a memory array compartmentalized into multiple first regions and second regions alternately arranged. The second regions are formed by odd and even columns alternately arranged. The semiconductor storage device may include: a memory mat array arranged in each of the first regions; a sense amp array arranged in each of the second regions; local IO lines arranged in each of the second regions and connected to the sense amp array; main IO lines crossing all of the first regions and the second regions; and a read/write amplifier arranged in each of the second regions and at one of intersection regions where the local IO lines cross the main IO lines. The read/write amplifier in one of the odd columns is connected to a first local IO line in said one of the odd columns and to a second local IO line in next one of the odd columns. The read/write amplifier in one of the even columns is connected to a third local IO line in said one of the even columns and to a fourth local IO line in next one of the even columns.

According to the semiconductor storage device, one amplifier such as a read/write amp is arranged at an intersection region of a local input-output line (LIO) with a main input-output line (MIO), while LIO to which no amplifier is connected is connected to, for example, an amplifier that is arranged at another intersection region that is two intersection regions away and connected to the same MIO. Thereby, one amplifier can be shared by two memory mats since two memory mats are not simultaneously selected. As a result, an increase in the area of the memory array can be prevented. Therefore, multiple I/O can be implemented without widening the regions among the memory mats.

BRIEF DESCRIPTION OF THE DRAWINGS

The above features and advantages of the present invention will be more apparent from the following description of certain preferred embodiments taken in conjunction with the accompanying drawings, in which.

DETAILED DESCRIPTION OF THE PREFERRED EMBODIMENTS

The invention will now be described herein with reference to illustrative embodiments. Those skilled in the art will recognize that many alternative embodiments can be accomplished using the teachings of the present invention and that the invention is not limited to the embodiments illustrated for explanatory purpose.

Figure 1:
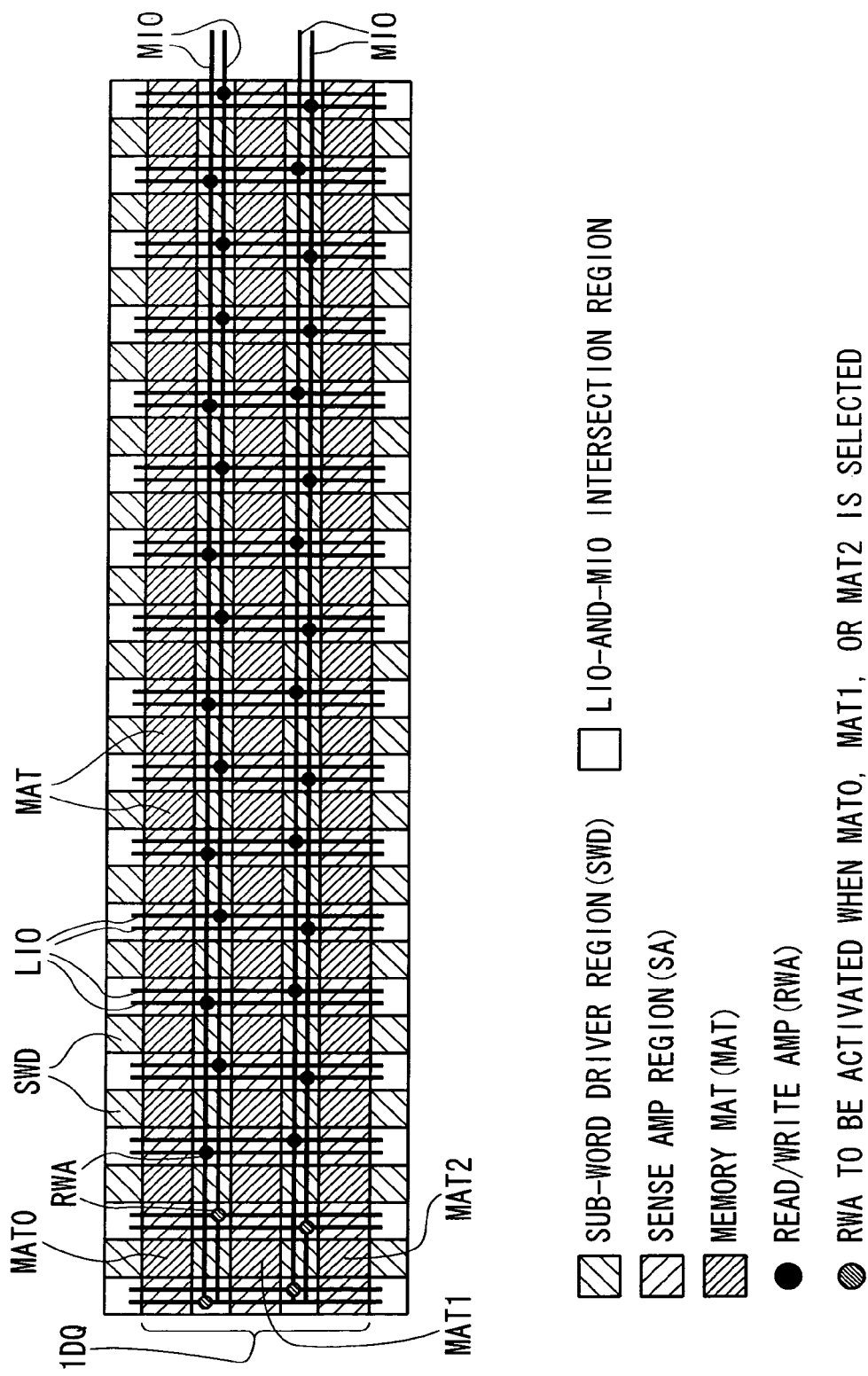
FIG. 1 schematically shows an example arrangement of read/write amps in a memory array.
Figure 2:
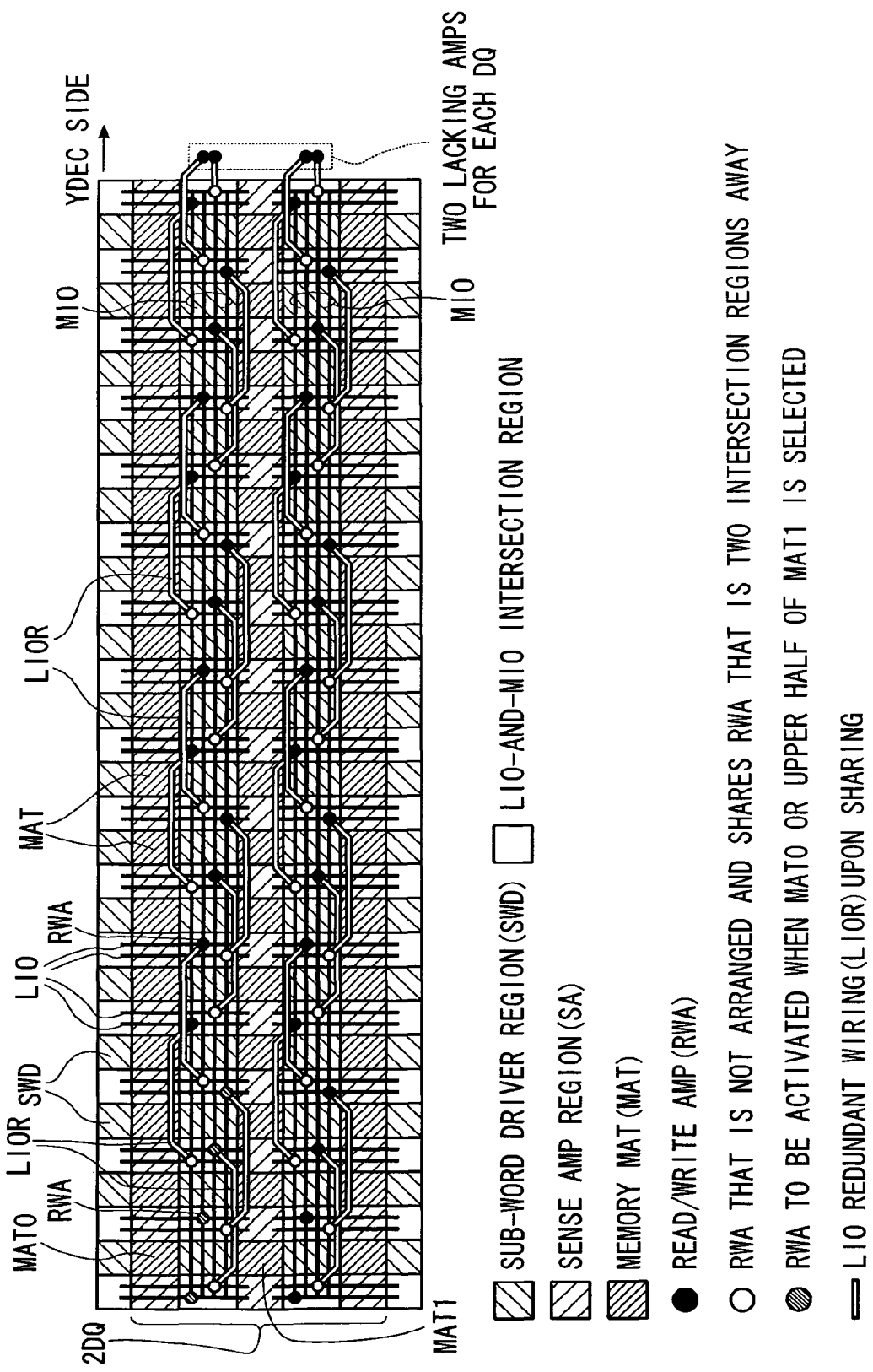
FIG. 2 schematically shows an example arrangement of read/write amps in a memory array according to a first embodiment of the present invention.
Figure 3:
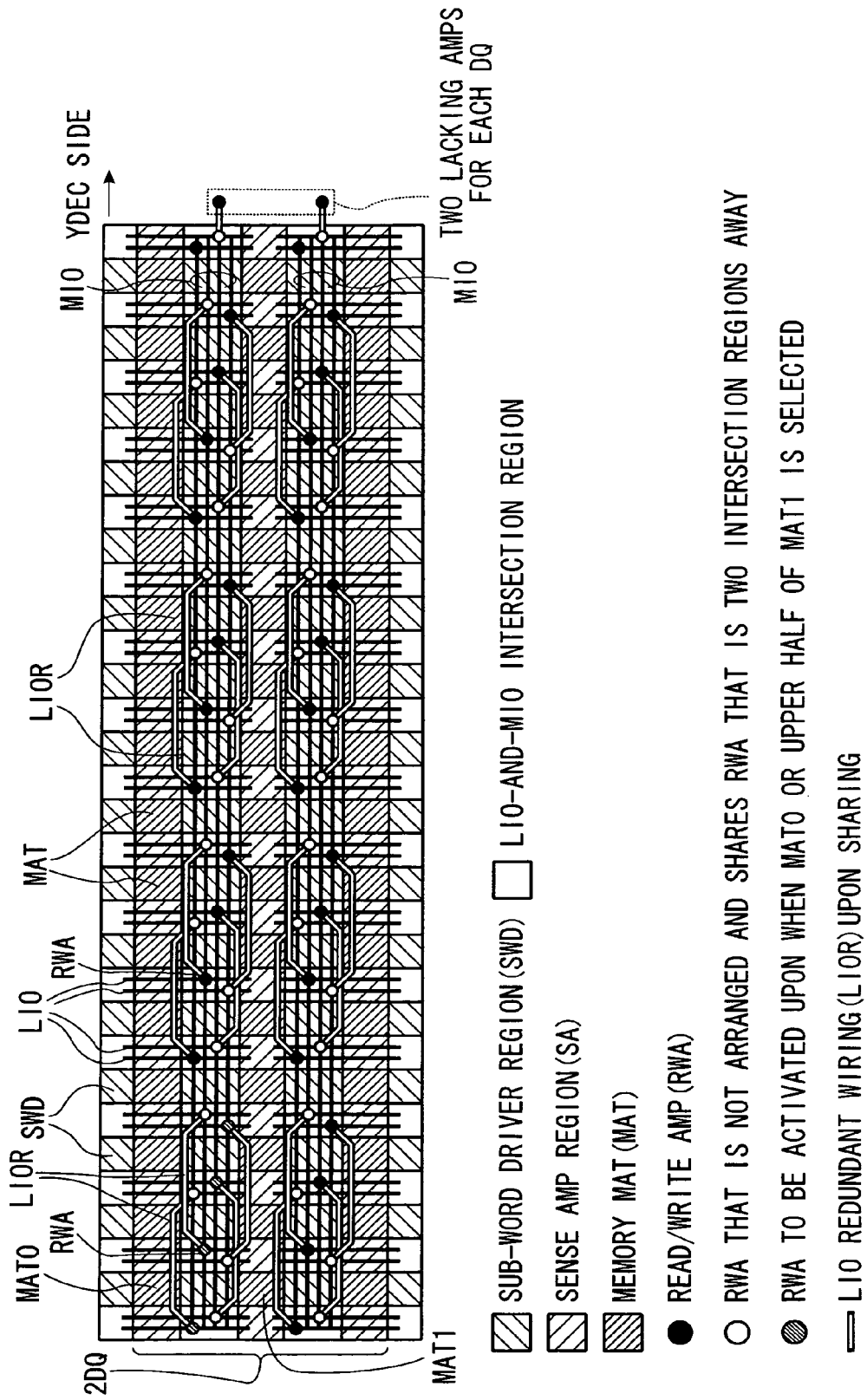
FIG. 3 schematically shows another example arrangement of read/write amps in a memory array according to the first embodiment of the present invention.

With reference to FIGS. 2 and 3 schematically showing arrangements of RWAs, a semiconductor storage device according to a first embodiment of the present invention is explained similarly to the case of FIG. 1. The semiconductor storage device includes a memory array compartmentalized into multiple first and second regions alternately arranged. The second regions are formed by odd and even columns alternately arranged. MATs are arranged in each of the first regions. Sense amps are arranged in each of the second regions. LIOs are arranged in each of the second regions and connected to the sense amps. MIOs cross all of the first regions and the second regions. An RWA is arranged in each of the second regions and at an LIO-and-MIO intersection region. An RWA in an odd column is connected to an LIO in the odd column and to an LIO in the next odd column. An RWA in an even column is connected to an LIO in the even column and to an LIO line in the next even column. Although the present invention is characterized in that one RWA is shared with multiple LIOs separated from each other, sharing patterns at the LIO-and-MIO intersection regions at the end of MIO are different between the configurations shown in FIGS. 2 and 3.

In FIGS. 2 and 3, a black circle and a hatched circle represent an RWA actually arranged at an LIO-and-MIO intersection region. A white circle represents a node where an RWA is not arranged and which is connected to another RWA connected to the same MIO and arranged at another LIO-and-MIO intersection region through an LIO redundant wiring LIOR. Two LIOs each indicated by a full line are paired to be complementarily related to each other. Two pairs of LIOs, i.e., four LIOs are wired in each column. Four MIOs are paired and wired in each row. An RWA indicated by a shaded circle is activated when MAT0 or an upper half of MAT1 is selected. Four RWAs (indicated by hatching) respectively arranged at four LIO-and-MIO intersections are activated, and then, all of the four MIOs can be accessed (reading or writing of data is enabled). Two pairs of four MIOs, i.e., eight MIOs are required for 2 DQs and 8-bit access.

Each RWA arranged at an LIO-and-MIO intersection region is connected to LIO and MIO at a black circle or a hatched circle, or at a white circle through an LIO redundant wiring (hereinafter, "LIOR"). In this manner, one RWA is shared by two MATs. Which LIO connected to one of the two MATs is selected is configured to be switched by a MAT selection signal.

In the configuration shown in FIG. 2, an LIOR is not provided to connect the RWA at the LIO-and-MIO intersection region at the left end of the illustration and the adjacent RWA on the right, and thereby a sharing relationship with another intersection region is not established. On the other hand, in the configuration shown in FIG. 3, an LIOR is provided to connect the RWA at the LIO-and-MIO intersection region at the left end of the illustration and the adjacent RWA on the right, and thereby a sharing relationship with another intersection region is established. In other words, the connection relationships of shared RWAs differ between FIGS. 2 and 3. Additionally, the short numbers of shared RWAs differ between FIGS. 2 and 3. The short number of RWAs is two for 1 DQ in the case of FIG. 2, and one in the case of FIG. 3. It is assumed that the short RWAs are arranged on the side of Y decoder (YDEC) in consideration of the area.

Figure 4:
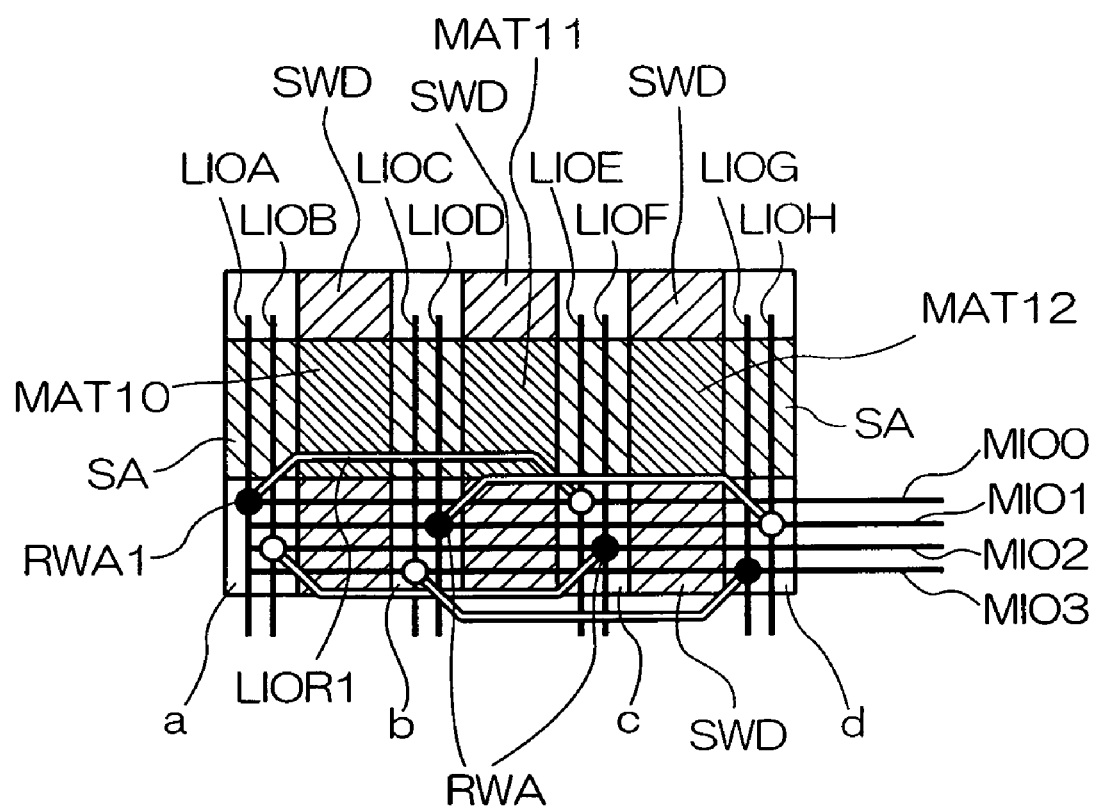
FIG. 4 is an enlarged view of three memory mats shown in FIGS. 2 and 3.

FIG. 4 is a partially enlarged view of FIGS. 2 and 3 where each portion is appended a reference character. Eight LIOs (LIOA to LIOH), four MIOs (MIO0 to MIO3), four LIO-and-MIO intersection regions a to d, and three memory mats MAT10 to MAT12 are shown in FIG. 4. Hereinafter, the configuration of RWA1 arranged at the intersection region a shown in FIG. 4 is explained with reference to FIG. 5.

Figure 5:
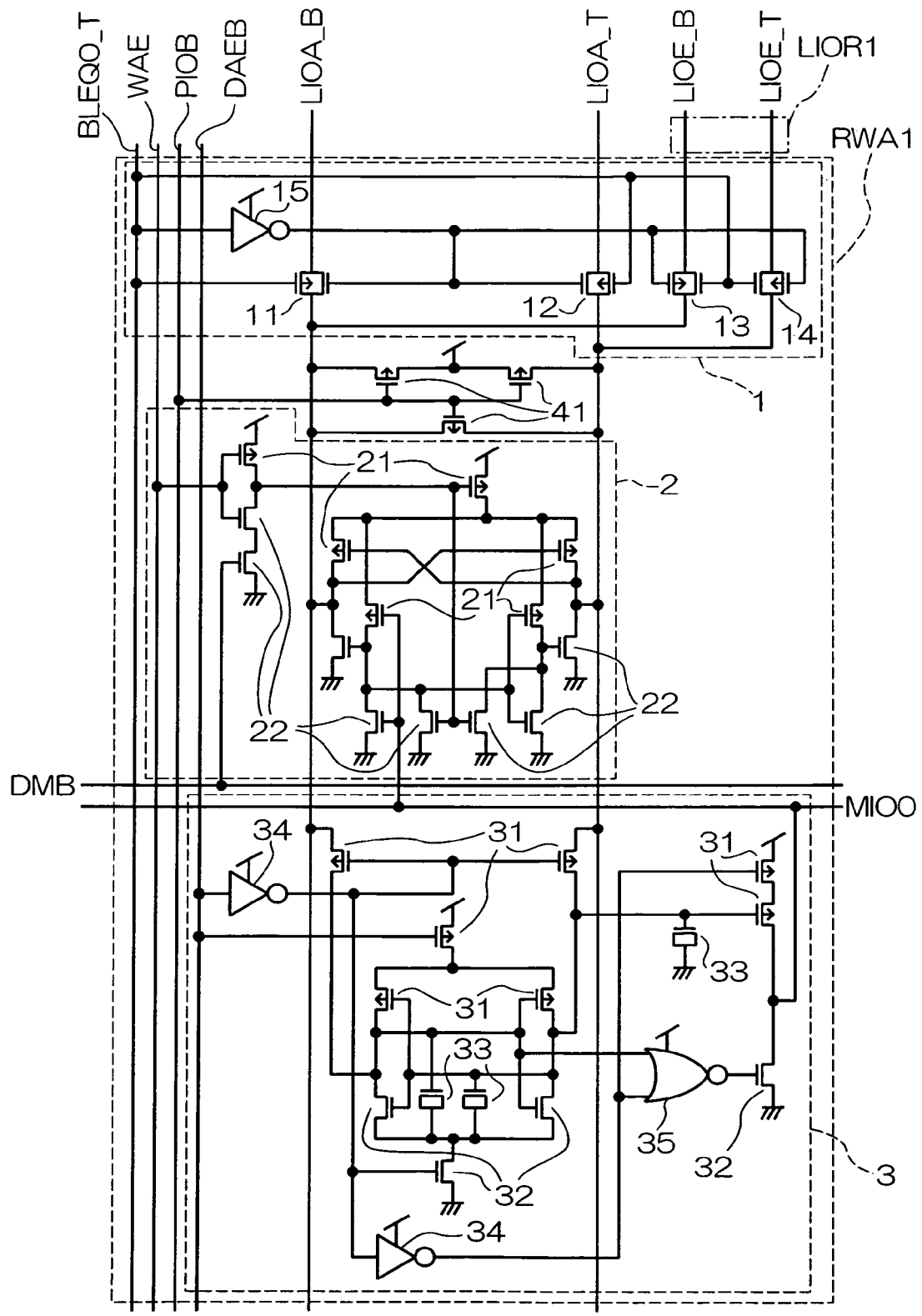
FIG. 5 is a circuit diagram of a read/write amp RWA1 shown in FIG. 4.

FIG. 5 is a circuit diagram of RWA1 indicated by a black circle at the LIO-and-MIO intersection region a shown in FIG. 4. The RWAs at the intersection regions b to d shown in FIG. 4 have similar configurations. However, a memory-mat selection signal BLEQ and the connection relationship of LIOs and MIOs are different. LIOR1 shown in FIG. 4 is indicted by a dashed-dotted line in FIG. 5.

RWA1 shown in FIG. 5 includes a sharing circuit 1 that is the newly provided configuration of the present invention, a write amp 2, a read amp 3, multiple N-channel MOS (Metal Oxide Semiconductor) transistors 41, and a circuit that equalizes a voltage between a pair of LIOs (LIOA_T and LIOA_B) corresponding to LIOA shown in FIG. 5.

The sharing circuit 1 includes four transfer gates 11 to 14 and an inverter 15 that receives the signal BLEQ0_T, and serves as a selector that switches between LIOs (LIOA and LIOE shown in FIG. 5) for the two memory mats to be shared using the memory-mat selection signal BLEQ.

A pair of transfer gates 11 and 12 is a circuit that connects or disconnects LIOA (LIOA_T and LIOA_B) to or from the write amp 2 and the read amp 3. A pair of transfer gates 13 and 14 is a circuit that connects or disconnects LIOE (LIOE_T and LIOE_B), which is two intersection regions away from LIOA, to or from the write amp 2 and the read amp 3. The pairs of the transfer gates 11 and 12 and the transfer gates 13 and 14 are controlled by BLEQ0_T that is one of multiple BLEQs that are memory-mat selection signals such that either one pair of the transfer gates is in a conductive state. In this case, the transfer gates 11 and 12 are in a conductive state (on-state) when the BLEQ0_T is low. When BLEQ0_T is high, the transfer gates 11 and 12 are in a non-conductive state (off-state). On the other hand, the transfer gates 13 and 14 are in a conductive state (on-state) when BLEQ0_T is high. The transfer gates 13 and 14 are in a non-conductive state (off-state) when BLEQ0_T is low.

The write amp 2 has the same configuration as one that is known, and includes multiple P-channel MOS transistors 21 and multiple N-channel MOS transistors 22. When signals WAE and DMB are high, the write amp 2 amplifies a signal on MIO0 and outputs the amplified signal to LIOA or LIOE that is connected to the write amp 2 through the sharing circuit 1.

The read amp 3 has the same configuration as one that is known, and includes multiple P-channel MOS transistors 31, multiple N-channel MOS transistors 32, a capacitor 33, an inverter 34, and an NOR circuit 35. When DAEB is high, the read amp 3 amplifies a signal on LIOA or LIOE that is connected to the read amp 3 through the sharing circuit 1, and outputs the amplified signal to MIO0.

Figure 6:
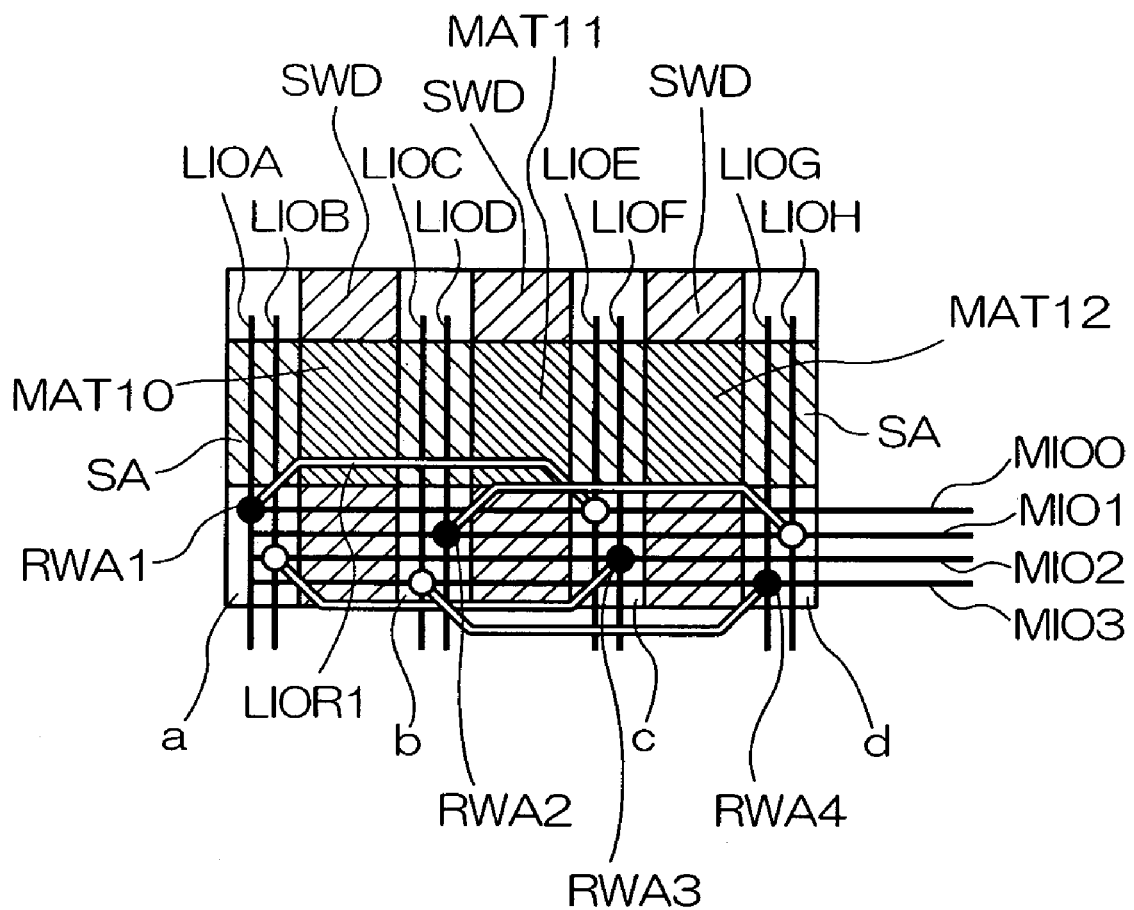
FIG. 6 is an enlarged view of three memory mats shown in FIGS. 2 and 3.
Figure 7:
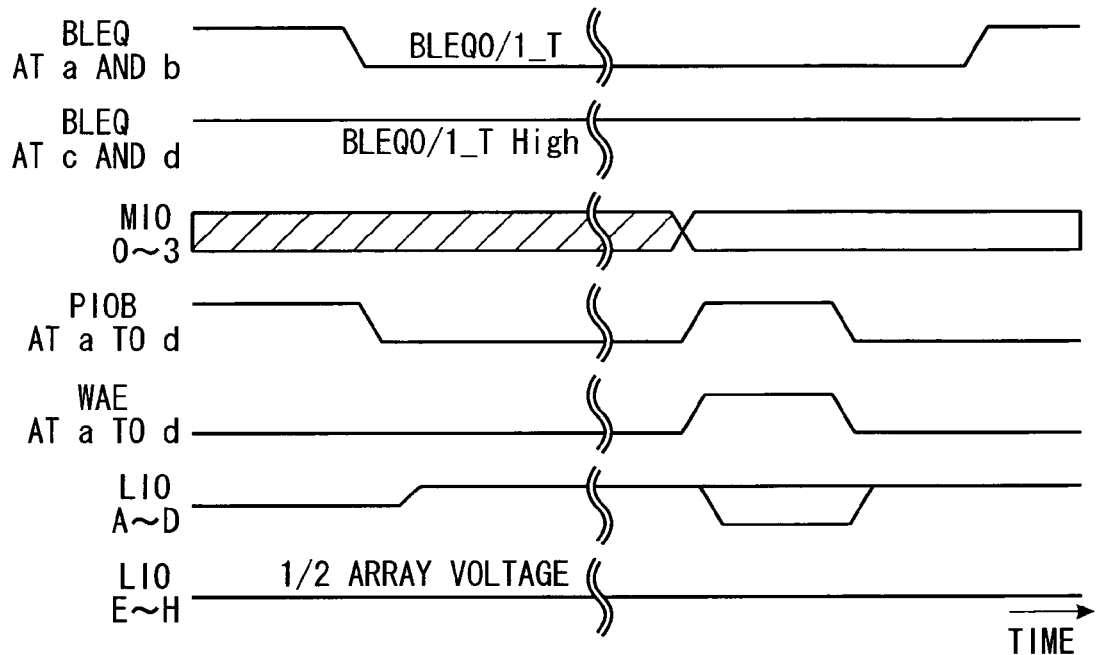
FIG. 7 schematically shows writing operation of a read/write amp RWA according to the first embodiment (when a memory mat MAT10 shown in FIG. 6 is selected)
Figure 8:
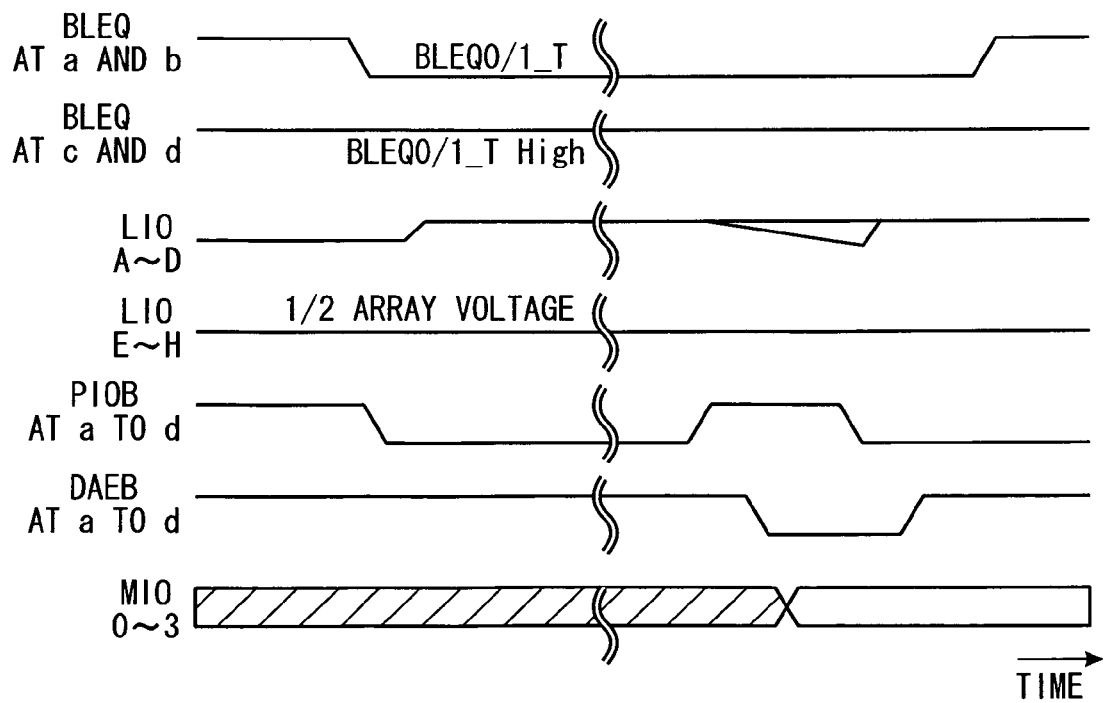
FIG. 8 schematically shows reading operation of the read/write amp RWA according to the first embodiment (when the memory mat MAT10 shown in FIG. 6 is selected)

Hereinafter, operations of RWA are explained with reference to FIGS. 6 to 8. FIG. 6 is an illustration of FIG. 4 to which reference characters are partially added. FIGS. 7 and 8 are timing charts schematically showing a writing operation and a reading operation when MAT10 shown in FIG. 6 is selected, respectively. When MAT10 is selected, a memory-mat selection signal MLEQ0_T or BLEQ1_T of the low level is input to RWA1 and RWA2 at the LIO-and-MIO intersection regions a and b, and another memory-mat selection signal BLEQ0_T or BLEQ1_T of the high level is input to RWA3 and RWA4 at the intersection regions c and d.

In RWA1 shown in FIG. 5 and RWA2 to RWA4 each having the same configuration as RWA1, the memory-mat selection signal BLEQ1_T or BLEQ0_T controls switching between the transfer gates 11 and 12, and the transfer gates 13 and 14. Thereby, the connections between the write amp 2 and the read amp 3, and LIOA to LIOH can be switched.

For example, the BLEQ signals at the intersection regions a and b shown in FIG. 6 become low when MAT10 is selected as shown in FIGS. 7 and 8. Accordingly, the transfer gates 11 and 12 change to a conductive state and the transfer gates 13 and 14 change to a non-conductive state. Then, LIOA and LIOD are selected at the intersection regions a and b and connected to MIO0 and MIO1 through RWA1 and RWA2, respectively. On the other hand, the BLEQ signal remains high at the intersection regions c and d shown in FIG. 6 since MAT11 and MAT12 are not selected. Accordingly, the transfer gates 11 and 12 change to a non-conductive state and the transfer gates 13 and 14 change to a conductive state. Then, LIOB and LIOC are selected at the intersection regions c and d, and connected to MIO2 and MIO3 through RWA3 and RWA4, respectively. Due to the circuit operations, four LIOs/MIOs operate simultaneously, and DDR2 can operate.

As explained above, according to the first embodiment of the present invention, one RWA is arranged at the LIO-and-MIO intersection region, LIO to which no RWA is connected is connected to RWA that is connected to the same MIO and at another intersection region that is two intersection regions away, so that RWA is shared by two memory mats. If RWA is arranged at another intersection region that is two intersection regions away, the memory mat is not simultaneously selected. Therefore, sharing of RWA is enabled, and an increase in the area of the array can be prevented.

In other words, according to the present invention, RWA in the memory array is shared by two memory mats, thereby preventing an increase in the area of the memory array. Particularly, the LIO-and-MIO intersection region at which one RWA is arranged and the LIO-and-MIO intersection region at which no RWA is arranged are provided in the present invention. Then, the LIO at the intersection region where no RWA is arranged is selectively connected to RWA arranged at another intersection region that is two intersection regions away through LIOR.

Figure 9:
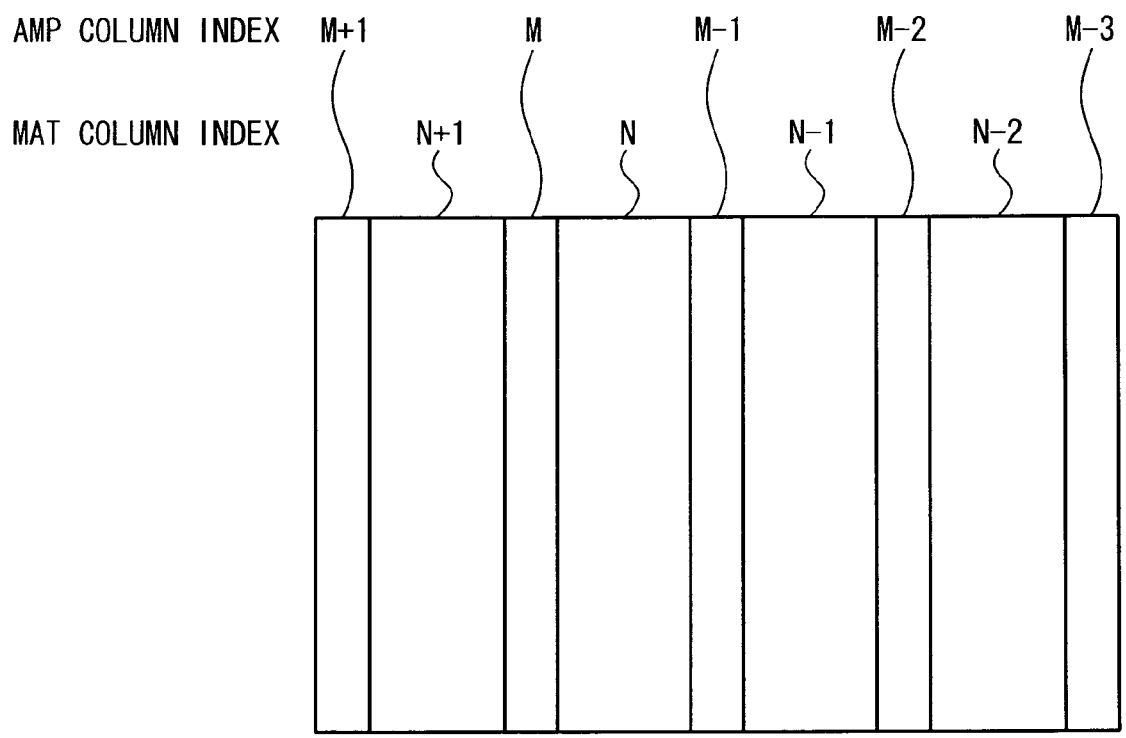
FIG. 9 schematically shows an arrangement of read/write amps and memory mats.

Conventionally, for example, only read/write amps at the M-th and the (M−1)-th columns are activated upon activation of a memory mat at the N-th column as shown in FIG. 9 showing the relationship between a read/write amp sequence and a memory-mat sequence. On the other hand, according to the present invention, read/write amps at the (M+1)-th, the M-th, the (M−1)-th, the (M−2)-th columns are activated upon activation of a memory mat at the N-th column when the same memory region is applied to 2 DQ, thereby preventing an increase in the area of the memory array.

The embodiments of the present invention are not limited hereto, and various modifications such that multiple read/write amps are shared, i.e., the number of pairs of LIOs and MIOs is increased, can be made. Additionally, the modification of moving constituent elements among the regions such that the transfer gates 13 and 14 are provided at another intersection region can be appropriately made.

It is apparent that the present invention is not limited to the above embodiments, but may be modified and changed without departing from the scope and spirit of the invention.

What is claimed is:

1. A semiconductor storage device including a memory array compartmentalized into a plurality of first regions and second regions alternately arranged, the second regions being formed by odd and even columns alternately arranged, the semiconductor storage device comprising:
   a memory mat array arranged in each of the first regions;
   a sense amp array arranged in each of the second regions;
   local IO lines arranged in each of the second regions and connected to the sense amp array;
   main IO lines crossing all of the first regions and the second regions; and
   a read/write amplifier arranged in each of the second regions and at one of intersection regions where the local IO lines cross the main IO lines, wherein
   the read/write amplifier in one of the odd columns is connected to a first local IO line in said one of the odd columns and to a second local IO line in next one of the odd columns, and
   the read/write amplifier in one of the even columns is connected to a third local IO line in said one of the even columns and to a fourth local IO line in next one of the even columns.

2. The semiconductor storage device according to claim 1, wherein each of the intersection regions includes one read/write amplifier.

3. The semiconductor storage device according to claim 1, wherein the read/write amplifier comprises:
   a sharing circuit that selects any one of the first local IO line and the second local IO line according to a memory-mat selection signal;
   a write amp that, upon a writing phase, amplifies a signal on one of the main IO lines and outputs the amplified signal to any one of the first IO line and the second IO line that is selected by the sharing circuit; and
   a read amp that, upon a reading phase, amplifies a signal on any one of the first local IO line and the second local IO line that is selected by the sharing circuit, and outputs the amplified signal to one of the main IO lines.

4. The semiconductor storage device according to claim 3, wherein the sharing circuit that includes a plurality of transfer gates that are controlled according to the memory-mat selection signal.

5. The semiconductor storage device according to claim 4, wherein
   the transfer gates include a first pair of transfer gates connected to the first local IO line and a second pair of transfer gates connected to the second local IO line through a local IO redundant line,
   the first pair of transfer gates changes to a conductive-state and the second pair of transfer gates changes to a non-conductive state so that the first local IO line is selected when the memory-mat selection signal is low, and
   the first pair of transfer gates changes to a non-conductive state and the second pair of transfer gates changes to a conductive-state so that the second local IO line is selected when the memory-mat selection signal is high.

6. The semiconductor storage device according to claim 3, wherein the write amp includes a plurality of P-channel MOS transistors and N-channel MOS transistors.

7. The semiconductor storage device according to claim 3, wherein the read amp includes a plurality of P-channel transistors and N-channel transistors, a capacitor, an inverter, and a NOR circuit.

* * * * *